United States Patent [19]
Johnson

[11] Patent Number: 5,107,309
[45] Date of Patent: Apr. 21, 1992

[54] DOUBLE DIFFUSED LEADOUT FOR A SEMICONDUCTOR DEVICE

[75] Inventor: Ralph H. Johnson, Plano, Tex.

[73] Assignee: Honeywell Inc., Minneapolis, Minn.

[21] Appl. No.: 649,206

[22] Filed: Jan. 25, 1991

Related U.S. Application Data

[63] Continuation of Ser. No. 452,522, Dec. 18, 1989, abandoned.

[51] Int. Cl.$^5$ .............................................. H01L 29/90
[52] U.S. Cl. .................................... 357/13; 357/26; 357/80; 357/55
[58] Field of Search .................. 357/26, 41, 13, 51, 357/80, 90, 55

[56] References Cited

U.S. PATENT DOCUMENTS

| | | | |
|---|---|---|---|
| 4,298,401 | 11/1981 | Nuez et al. | 357/13 |
| 4,314,226 | 2/1982 | Oguro et al. | 357/26 |
| 4,605,948 | 8/1986 | Martinelli | 357/13 |
| 4,658,279 | 4/1987 | Guckel | 357/26 |
| 4,766,469 | 8/1988 | Hill | 357/13 |

FOREIGN PATENT DOCUMENTS

| | | | |
|---|---|---|---|
| 56-12779 | 2/1981 | Japan | 357/13 |
| 60-097676 | 5/1985 | Japan | 357/26 |
| 59-136977 | 8/1987 | Japan | 357/26 |

Primary Examiner—Andrew J. James
Assistant Examiner—Hung Yuan Dang
Attorney, Agent, or Firm—Robert B. Leonard

[57] ABSTRACT

A structure and a device which allow low resistance connections to internal circuit devices comprising a double diffused leadout is described. The first leadout diffusion is lightly doped with dopant from either chemical group III or V to constitute N− or P− type material respectively. The lightly doped region has a high resistivity. The second diffusion is diffused, using a dopant from the same chemical group as the first dopant, into the first diffusion. The second diffusion is diffused with enough dopant to constitute N+ or P+ material and has a low resistivity. The double diffused leadout creates a low resistance connection to the internal circuitry of an IC device while maintaining breakdown with the protective overlayer.

3 Claims, 2 Drawing Sheets

DOUBLE DIFFUSED LEADOUT FOR A SEMICONDUCTOR DEVICE

This application is a continuation of application Ser. No. 07/452,522, filed Dec. 18, 1989 now abandoned.

BACKGROUND OF THE INVENTION

This invention is related to the field of semiconductor devices. More specifically, the invention is a leadout for diffused circuit elements in semiconductor devices which reduces surface effects and parasitic resistance and a method of making the leadout.

Semiconductor devices have defined paths of low resistivity which can be used as interconnections to external circuitry. Generally, the leadout is created by highly doping a region of the device by diffusing extra donors or acceptors into a portion of the semiconductor device. However, this diffusion must have a long tail with a small grading coefficient so that breakdown with a protective overlayer can be avoided. To avoid breakdown, a deep diffusion is required. A deep diffusion requires long diffusion times and the depth of the diffusion is limited by the depth of the device. Because of the time required and a maximum depth constraint, there is a minimum sheet resistance which is obtainable. It is desirable to have a lower sheet resistance leadout to reduce the drift caused by electrical surface effects over the contacting material and to reduce parasitic resistance.

SUMMARY OF THE INVENTION

The invention is a double diffused leadout which is comprised of two parts. First, a high resistivity lightly doped diffusion is deeply diffused into the semiconductor device. Then, a second low resistivity heavily doped diffusion is diffused into the first diffusion, but out of contact with the protective overlayer. Breakdown voltage with the overlayer is maintained while introducing a low resistance contact to the circuit elements contained within the semiconductor device.

BRIEF DESCRIPTION OF THE DRAWINGS

FIG. 2D shows the semiconductor device of FIG. 1 along the line 2A-2D.

DETAILED DESCRIPTION OF THE DRAWINGS

Figure 1:
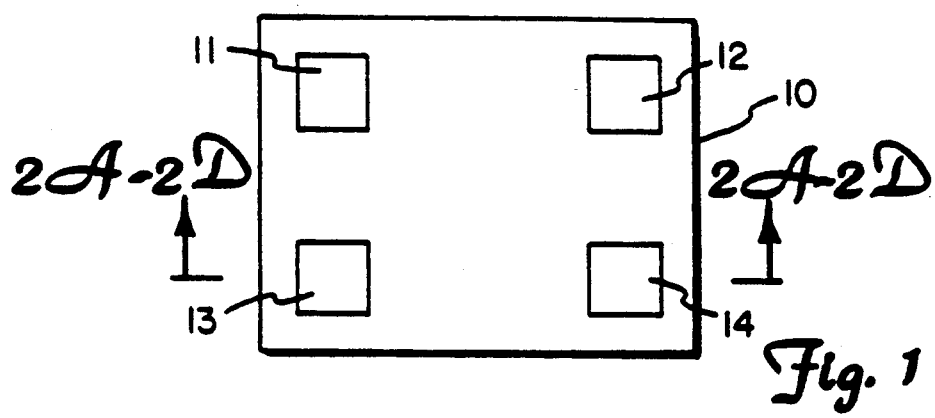
FIG. 1 shows an external top view of a semiconductor device having the inventive leadouts or contacts.

Referring now to FIG. 1, there shown is a top view exterior of a semiconductor device 10 having leadouts 11, 12, 13 and 14 comprising the present invention. For this embodiment, the semiconductor device has a representative number of four of the inventive leadouts.

Turning now to FIGS. 2A through 2D there shown is the semiconductor device including the leadouts or contacts of the present invention. For purposes of this description, the semiconductor device to be described will be a pressure transducer, although other semiconductor devices could use the present invention as well.

Figure 2A:
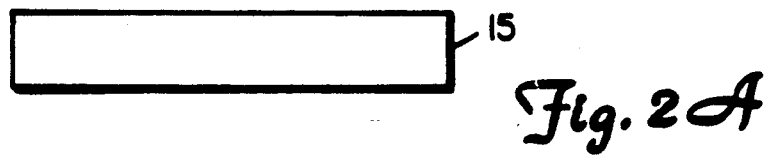
FIGS. 2A through 2D show the semiconductor device in various stages of the construction.
Figure 2B:
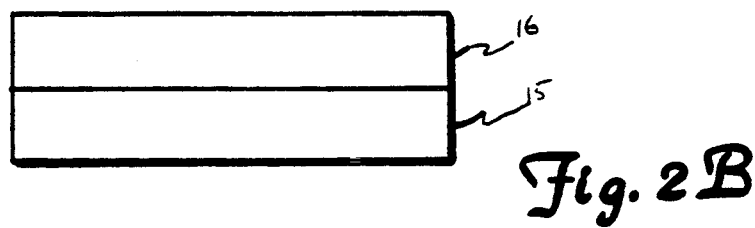
Figure 4:
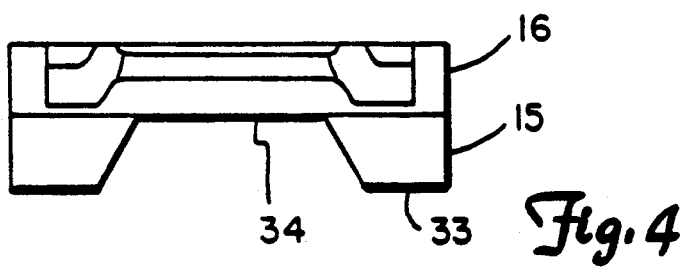
FIGS. 4 and 4A show the semiconductor transducer invention with a recess.
Figure 4A:
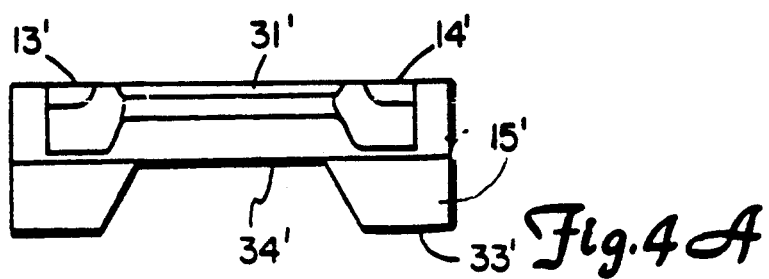

In FIG. 2A, a substrate of material 15 is formed. Here, there is a doped substrate with a group III element such as boron to create p type material. Note, that for this step, or any of the other steps, an opposite conductivity type may be used from the one described if opposite conductivity types are used throughout the device such as is shown in FIG. 4A. Next, a layer of n type material 16, formed by doping silicon with a group V element such as phosphorus, is grown on or placed next to and bonded to the p type substrate. This is shown in FIG. 2B. The n type layer may be bonded to the substrate by methods such as wafer to wafer bonding or epitaxial growth.

Figure 2C:
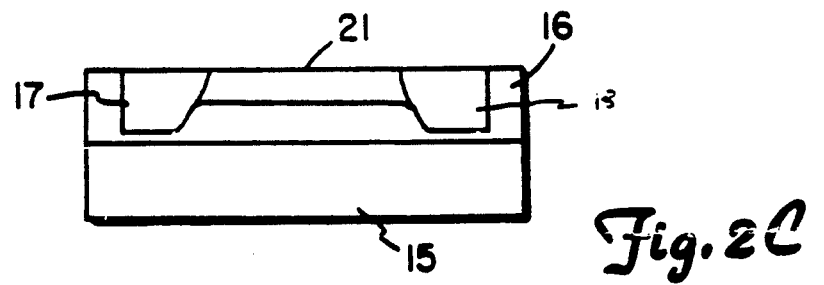

FIG. 2C shows two diffusions 17 and 18 of lightly doped or p− type material into the n type layer. Resistor 21 of p− material is diffused into the n type layer between regions 17 and 18. The diffusion of resistor 21 may also be performed after the diffusion of leadouts 13 and 14. Note that diffusions 17 and 18 are diffused deeper into the n layer than is resistor 21.

Figure 2D:
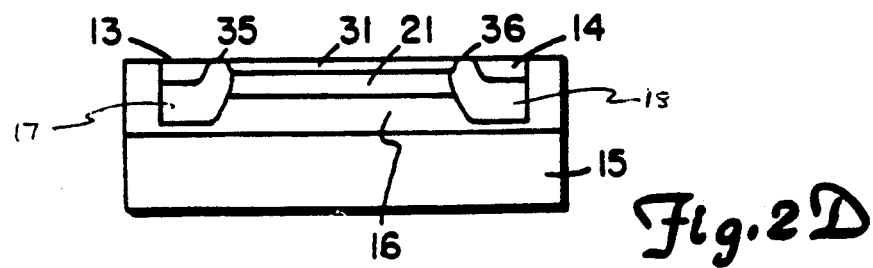
Figure 3:
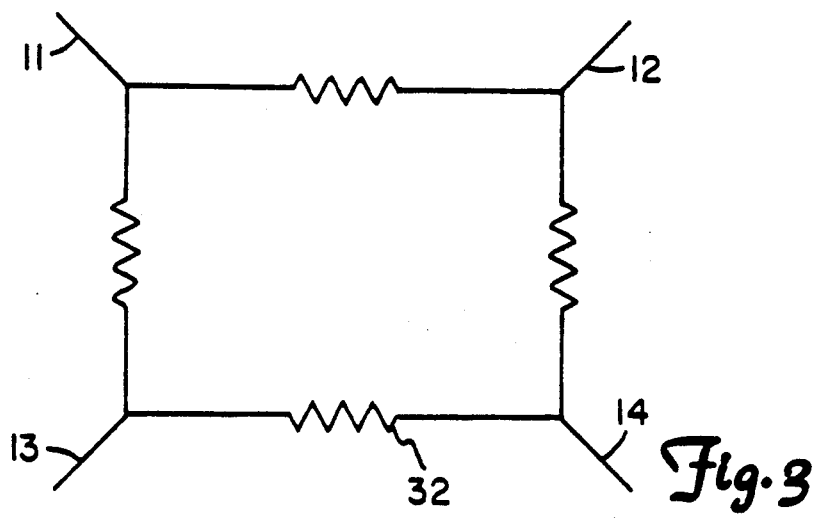
FIG. 3 shows a schematic diagram representation of the electrical circuit used in the illustrative device.

FIG. 2D shows the device as viewed along line 2A-2D of FIG. 1 at completion. P+ leadouts 13 and 14 consisting of silicon having a high doping of boron, are diffused into regions 17 and 18 of the p− diffusion. In addition, an n type overlayer 31 is diffused into resistor 21 and may extend outside resistor 21 orthogonally to the plane of the drawing to contact the n layer 16. The overlayer 31 does not contact either of the p+ leadouts 13 and 14, and is separated from the n layer 16 by portions 35 and 36 of p− diffusions 17 and 18 and resistor 21. FIG. 3 shows a schematic representation of the circuit created by the above described device. Note that the structure shown as existing along line 2A-2D is present between any selected contact and the two contacts lying on mutually orthogonal lines extending from the contact.

Finally, to complete the transducer, a portion of the p substrate is etched away leaving a rim 33 supporting a diaphragm 34 containing the resistors. This can be seen in FIG. 4.

It should also be noted that the present novel leadout can be used where a low resistance leadout to a circuit element having an opposite conductivity type from the overlayer is desired.

An example of the peak doping levels for the best mode presently contemplated by the inventor would be:

p type material = $1 \times 10^{19}$ atoms/cm$^3$ group III element p+ type material = $1 \times 10^{20}$ atoms/cm$^3$ group III element p− type material = $7.00 \times 10^{17}$ atoms/cm$^3$ group III element n type material = $2 \times 10^{15}$ atoms/cm$^3$ group V element overlayer n type $7 \times 10^{17}$. Since these are diffusion regions, the doping profiles have significant widths, the average doping level being less than the peak doping level.

The above doping levels are meant to be representative, not exclusive. Other combinations will be obvious to one of ordinary skill in the art.

The foregoing has been a description which allows one of ordinary skill in the art to make and use the described contact. However, the applicant only intends to limit the invention by the claims appended hereto.

I claim:

1. A semiconductor device, comprising:

a substrate formed from silicon having a first conductivity type and a first doping level, said substrate further having a first major surface;

a first layer formed on said first major surface from silicon having a second conductivity type, said first layer having a second major surface and a second doping level;

a resistor formed from silicon having said first conductivity type formed in said first layer;

an overlayer formed from silicon having said second conductivity type formed in said first layer at said second major surface;

a first diffusion formed within said first layer from silicon having a first conductivity type and a second doping level, said first diffusion being electrically connected with said resistor; and a second diffusion formed from silicon having the same conductivity type as said first diffusion but a third doping level which is more heavily doped than both of said first and second doping levels, said second diffusion being formed in at least a portion of said first diffusion and out of physical contact with said overlayer, said second diffusion being usable as a leadout and contact for external circuitry.

2. The leadout in a semiconductor device of claim 1, wherein:

said first conductivity type is silicon doped with a group V element, said first doping level requiring that the silicon be doped with a normal amount of dopant to constitute n material; and said second conductivity type is silicon doped with a group III type element, said second doping level requiring that the silicon be lightly doped to constitute lightly doped p material, and said third doping level requiring that the silicon be doped with sufficient dopant to constitute heavily doped p material.

3. A semiconductor device, comprising:

a substrate formed from silicon having a first conductivity type and a first doping level; said substrate further having a first major surface;

a first layer formed on said first major surface from silicon having a second conductivity type, said first layer having a second major surface and a second doping level;

a resistor formed from silicon having said first conductivity type, said resistor being formed in said first layer;

an overlayer formed from silicon having said second conductivity type formed in said first layer at said second major surface;

a first diffusion formed within said first layer from silicon having a first conductivity type and a second doping level, said first diffusion being electrically connected with said resistor; and a second diffusion formed from silicon having the same conductivity type as said first diffusion but a third doping level which is more heavily doped than both of said first and second doping levels, said second diffusion being formed in at least a portion of said first diffusion and being formed so that a portion of said first diffusion isolates said second diffusion from said overlayer.

* * * * *